United States Patent [19]

Moriya

[11] Patent Number: 4,766,371

[45] Date of Patent: Aug. 23, 1988

[54] TEST BOARD FOR SEMICONDUCTOR PACKAGES

[75] Inventor: Tadashi Moriya, Osaka, Japan

[73] Assignee: Risho Kogyo Co., Ltd., Osaka, Japan

[21] Appl. No.: 875,517

[22] Filed: Jun. 19, 1986

Related U.S. Application Data

[63] Continuation of Ser. No. 474,035, Mar. 10, 1983, abandoned.

[30] Foreign Application Priority Data

| Jul. 24, 1982 | [JP] | Japan | 57-112481[U] |
| Sep. 14, 1982 | [JP] | Japan | 57-140932[U] |
| Sep. 24, 1982 | [JP] | Japan | 57-145547[U] |
| Sep. 29, 1982 | [JP] | Japan | 57-149282[U] |

[51] Int. Cl.[4] .................. G01R 31/02; H05K 1/00
[52] U.S. Cl. .................. 324/158 F; 439/66; 439/68
[58] Field of Search .......... 324/158 F, 158 P; 339/17 CF; 174/52 FP; 439/66, 91, 55, 68

[56] References Cited

U.S. PATENT DOCUMENTS

| 3,832,632 | 8/1974 | Ardezzone | 324/158 P |
| 3,940,786 | 2/1976 | Scheingold et al. | 324/158 F |
| 4,118,092 | 10/1978 | Sado et al. | 339/17 CF |
| 4,295,700 | 10/1981 | Sado | 439/66 |
| 4,324,040 | 4/1982 | Gottlieb | 324/158 F |
| 4,330,165 | 5/1982 | Sado | 439/91 |
| 4,346,952 | 8/1982 | Bright et al. | 339/17 CF |
| 4,402,561 | 9/1983 | Grabbe et al. | 339/17 CF |
| 4,504,783 | 3/1985 | Zasio et al. | 324/73 R |
| 4,506,938 | 3/1985 | Madden | 339/17 CF |

*Primary Examiner*—Ernest F. Karlsen
*Attorney, Agent, or Firm*—Wenderoth, Lind & Ponack

[57] ABSTRACT

A test device for burn-in tests of semiconductor packages. The device includes a printed circuit board provided with openings or frames for receiving the semiconductor packages to be tested and aligning the package lead with circuit board terminals. A cover plate provided with elastic bodies on a back side thereof is used to concurrently elastically press all of the leads and terminals into electrical contact. In one embodiment, elastic connectors having thin metal wires embedded therein are provided in the openings or frames to electrically connect the leads to the terminals when the cover plates is pressed downwards on the semiconductor packages.

2 Claims, 8 Drawing Sheets

12

12

12

12

12

12

12

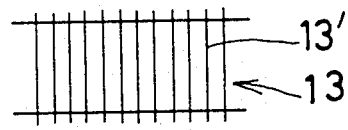
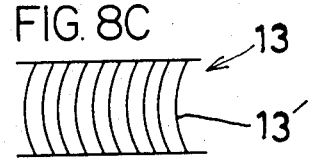
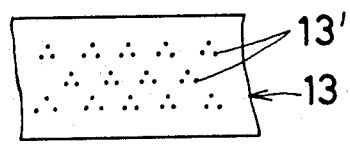
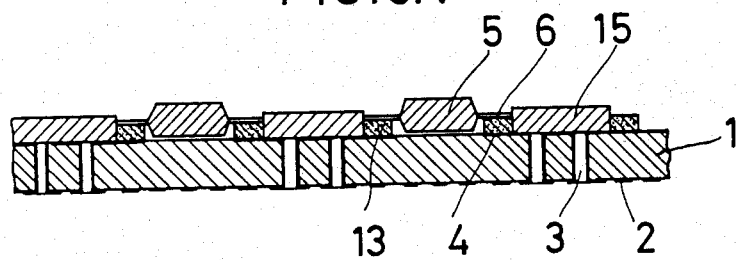
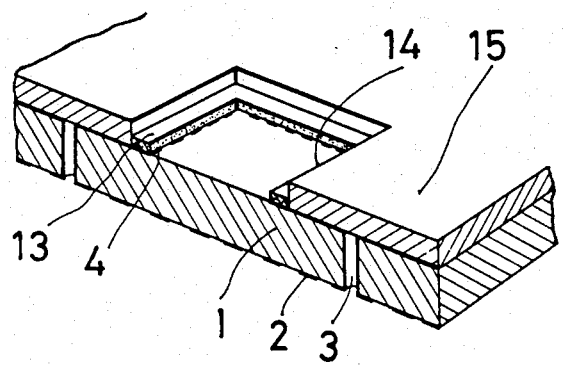

TEST BOARD FOR SEMICONDUCTOR PACKAGES

This application is a continuation of now abandoned application Ser. No. 474,035, filed Mar. 10, 1983.

BACKGROUND OF THE INVENTION

The present invention relates to test boards used for burn-in tests of semiconductor packages such as IC and LSI, particularly to test boards with which a large number of semiconductor packages can be tested at one time to save the time and labor required for testing.

In the electronics industry, there is a trend toward miniaturization of semiconductor packages to meet the requirement of higher compactness for electronic devices. The conventional dual-in-line packages with lead pins adapted to be received in holes in a printed circuit board had a shortcoming of permitting limited miniaturization because the distance between the lead pins can be decreased only so much. Therefore, they have been replaced by new types of packages which include flat type packages with lead pins extending from four sides in a horizontal direction, small outline packages or mini-flat packages which are more compact than the flat type and have lead pins extending horizontally from two sides, and ceramic tip carrier type packages with no lead pins.

Such semiconductor packages have been heretofore tested in accordance with a sampling inspection plan using a socket such as is shown in FIG. 1. A conventional method for testing was to attach the sockets as by soldering in positions on a printed circuit board, to put the packages to be tested one by one in the sockets by hand or with a pincette, to close the lid of the sockets to provide connection between the lead pins of the package and the terminals on each socket, and to subject the packages to a burn-in test at a high temperature. After testing, the lids are opened and the tested packages are removed from the sockets one by one.

The conventional method using such a socket had the following shortcomings:

(1) Because each socket had to have a lid and a connector and therefore occupied a considerable space, only a limited number of sockets could be mounted for testing on one printed circuit board.

(2) It requires much labor and time to mount and dismount the packages by hand on and from the sockets.

(3) The spring used to press the lead pins of the package against the terminals on the socket is liable to deteriorate, causing poor connection.

(4) To meet the requirement for heat resistance, the sockets have to be made of expensive heat-resistant resin. This makes expensive the printed circuit board for testing on which the sockets are mounted.

On the other hand, users of semiconductor packages sometimes request package manufacturers to perform total or 100% inspection instead of sampling inspection to screen out all the defective parts before delivery. In order to meet this requirement, a test board is needed with which a large number of semiconductor packages can be tested at one time to save time and labor.

An object of the present invention is to provide a test board for semiconductor packages which meet the above-mentioned requirement.

BRIEF DESCRIPTION OF THE DRAWINGS

Other objects and features of the present invention will become apparent from the following description taken with reference to the accompanying drawings, in which:

FIGS. 8A and 8C are sectional views of two examples of the elastic connector used in the present invention;

FIG. 8B is a plan view of the elastic connectors of FIGS. 8A and 8C;

FIG. 9A is a sectional view of the second embodiment with the packages mounted;

FIG. 9B is a perspective view of the same;

DETAILED DESCRIPTION OF THE PREFERRED EMBODIMENTS

Figure 1:
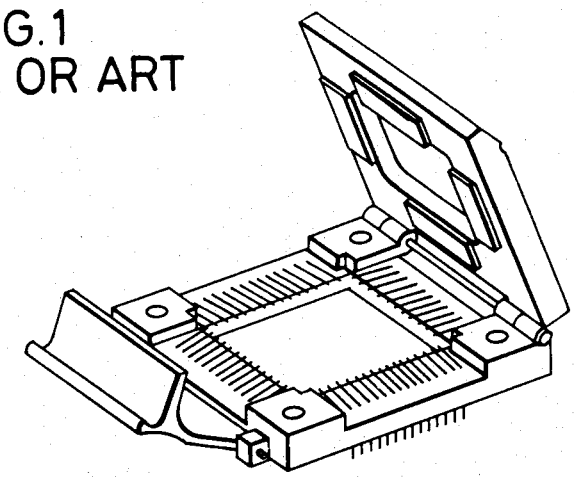
FIG. 1 is a perspective view of a socket used in the conventional method.

Referring to FIGS. 2-5 showing the first embodiment, an insulated board 1 is provided with copper cladding on both sides etched to form a desired circuit 2 on both sides. The insulated board is then plated for through holes 3 and terminals 4 as required. The test board according to the present invention further includes a plurality of positioning frames 8 for positioning semiconductor packages 5 to be tested in position on the printed circuit board 1. Each positioning frame 8 is formed with a tapered top surface 9 for easy mounting and removal of the package. It is also formed with projections 10 extending from the bottom and received in holes in the board 1 for connection to the test board. It may be formed with projections 11 extending inwardly for a secure positioning of the package 5.

Figure 6A:
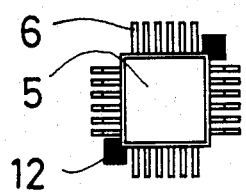
FIGS. 6A-6C are plan views showing where the holders for the package are mounted.
Figure 6B:
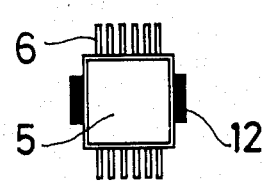
Figure 6C:
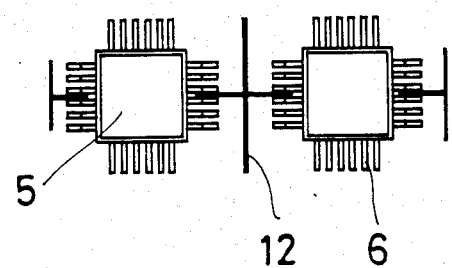

Referring to FIGS. 6A-6C and 7A-7S showing the second embodiments, holders 12 are mounted on the printed circuit board 1 as by melting, adhering or inserting to hold the semiconductor package 5 in position for contact between the lead pins Of the package and the terminals on the printed circuit board. The holders 12 may be attached at corners of the package as shown in FIG. 6A, at its sides as shown in FIG. 6B, or between the lead pins 6 of the package as shown in FIG. 6C. The holder may also be adapted to serve not for a single package but for two packages as the middle one shown in FIG. 6C.

Figure 7A:
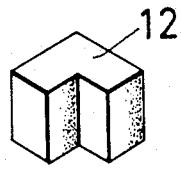
FIGS. 7A-7S are perspective views of various examples of the fixing frame.
Figure 7B:
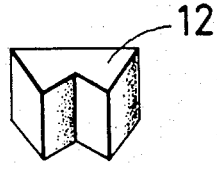
Figure 7C:
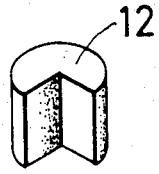
Figure 7D:
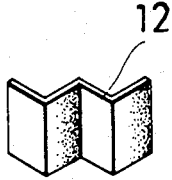
Figure 7E:
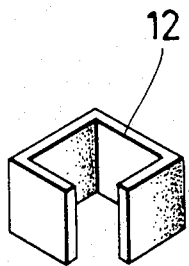
Figure 7F:
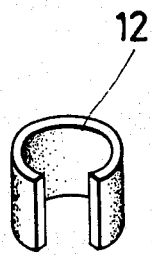
Figure 7G:
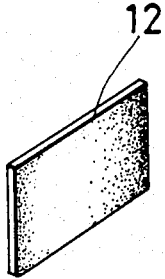
Figure 7H:
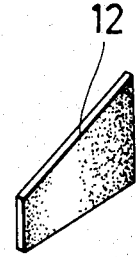
Figure 7I:
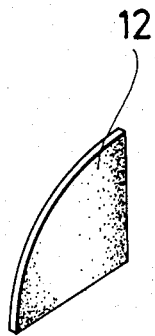
Figure 7J:
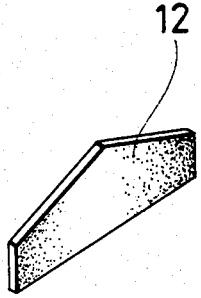
Figure 7K:
Figure 7L:
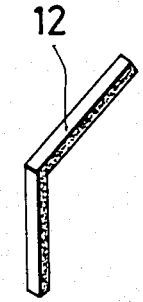
Figure 7M:
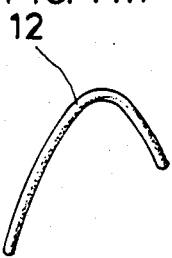
Figure 7N:
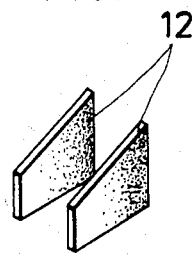
Figure 7O:
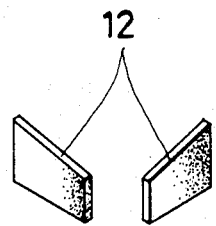
Figure 7P:
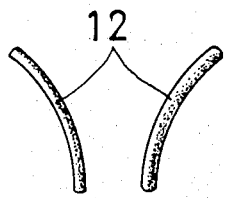
Figure 7Q:
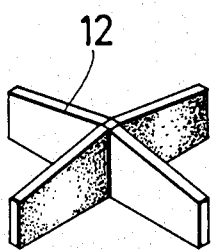
Figure 7R:
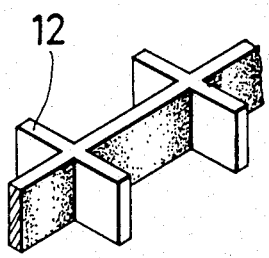
Figure 7S:
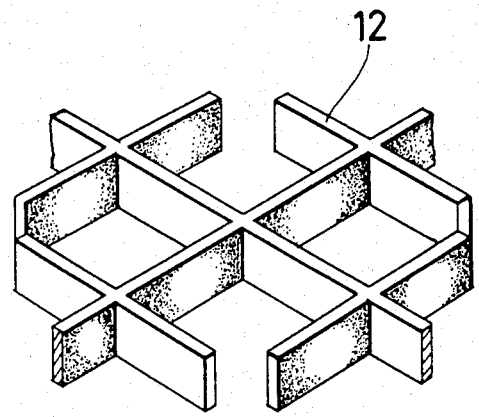

The holders 12 may be of any shape. By way of examples, some are shown in FIGS. 7A–7S. They may be in the form of a plate, bar (round or square), or pipe. They should be made of a material having a good resistance to heat and humidity. For the holders arranged close to the lead pins 6 of the package or the circuit 2 or terminal 4 on the printed circuit board, the material should be a good electrical insulator.

Referring to FIG. 9A-12, heat-resistant elastic connectors 13 as shown in FIGS. 8A-8C are used to insure contact between the lead pins of the semiconductor packages 5 and the terminals 4 on the printed circuit board 1. The elastic connector 13 comprises an elastic sheet made, for example, of silicone rubber, in which thin metal wires 13' (about 25 microns thick) are embedded vertically (FIG. 8A), or arcuately (FIG. 8C), in groups consisting of three wires as shown in FIG. 8B.

In the embodiment of FIG. 8A the wires project slightly from the upper and lower surfaces of the elastic sheet.

In the embodiment of FIGS. 9A and 9B, the semiconductor packages 5 are mounted in the holes 14 formed in a frame plate 15 which is adhered to or fitted in the printed circuit board 1. The elastic connectors 13 are put in the holes 14 under the lead pins 6 of the semiconductor packages 5.

Figure 10A:
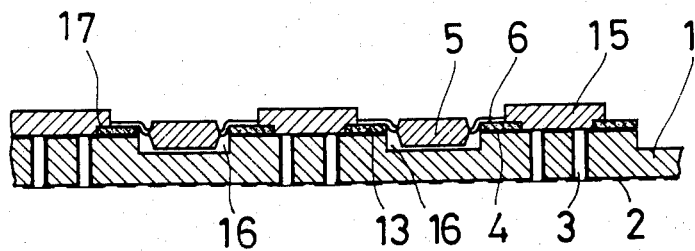
FIG. 10A is a sectional view of the third embodiment.
Figure 10B:
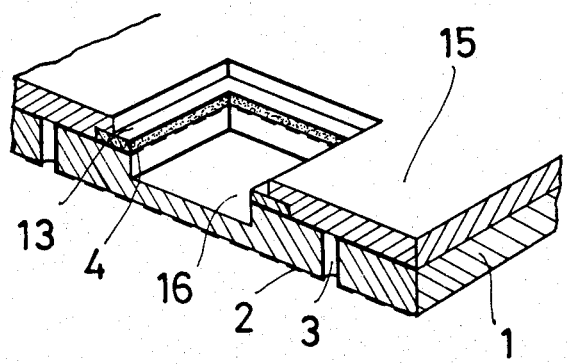
FIG. 10B is a perspective view of the same.

The embodiment of FIGS. 10A and 10B is similar to that of FIG. 9A except that the printed circuit board 1 is formed with recesses 16 in its upper surface to receive the semiconductor packages 5 and that the elastic connectors 13 are inserted under the lead pins 6 of the packages 5 into indentations 17 formed in the bottom surface of the frame plate 15.

Figure 2:
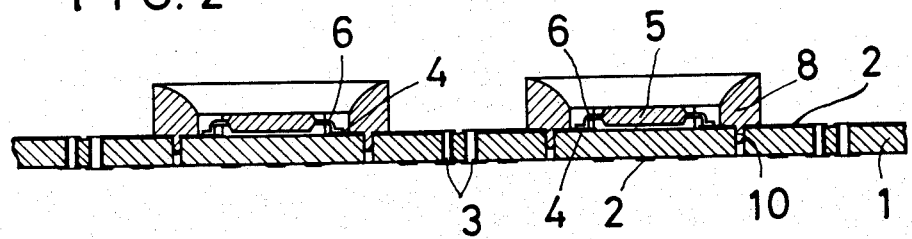
FIG. 2 is a sectional view of the first embodiment showing packages mounted thereon.
Figure 3:
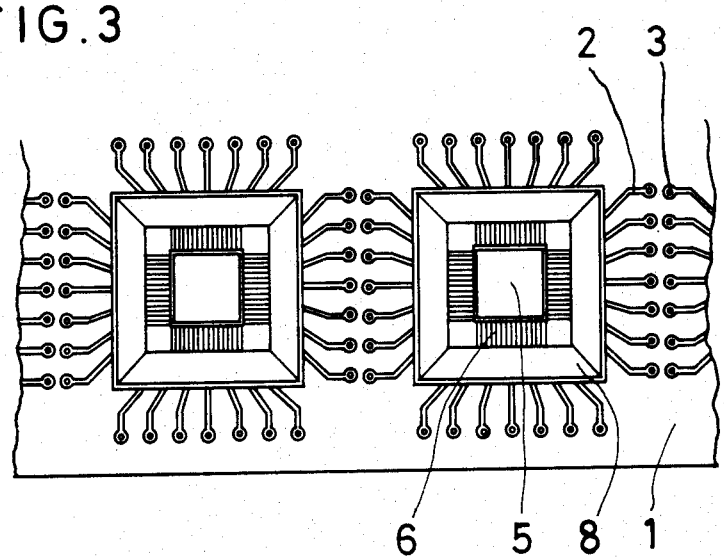
FIG. 3 is a plan view thereof.
Figure 4:
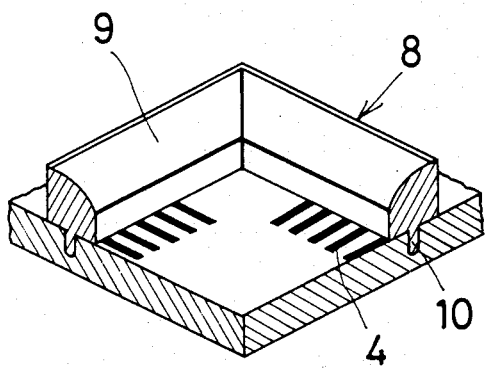
FIG. 4 is a partially cutaway perspective view of an example of the fixing frame used in the present invention.
Figure 5:
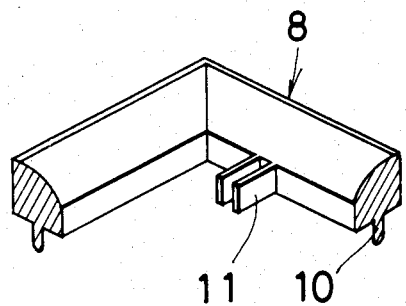
FIG. 5 is a similar view of another example of the fixing frame.
Figure 11A:
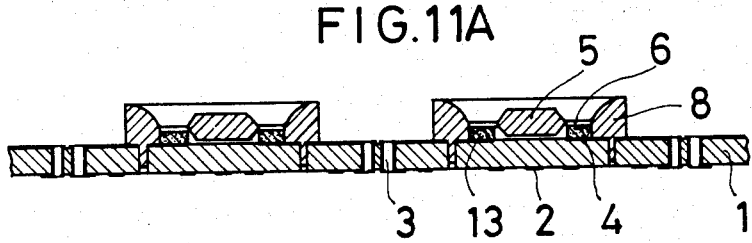
FIG. 11A is a sectional view of the fourth embodiment.
Figure 11B:
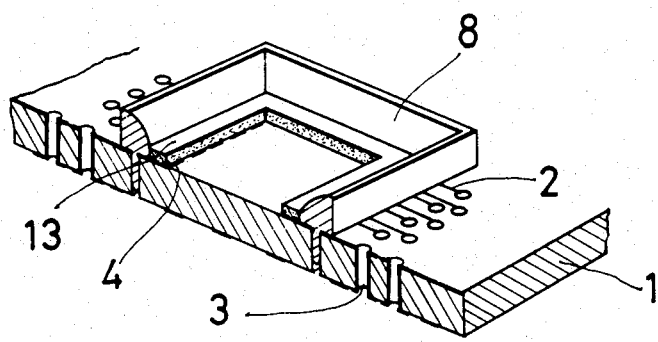
FIG. 11B is a perspective view of the same.

The embodiment of FIGS. 11A and 11B is similar to that of FIG. 2 except that the elastic connector 13 is mounted in the fixing frame 8 under the lead pins 6 of the package 5.

Figure 12:
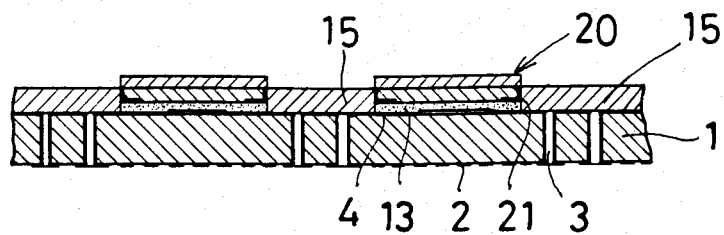
FIG. 12 is a sectional view of the fifth embodiment.

The embodiments of FIGS. 9A to 11B are intended for testing of flat type packages whereas the embodiment of FIG. 12 is intended for ceramic tip carrier type packages 20 having no lead pins but a lead portion 21 which does not project sideways.

In the embodiment of FIG. 12, the ceramic tip carrier type packages 20 are mounted in the holes 14 in the frame plate 15 with the elastic connectors 13 put between the lead portions 21 of the packages 20 and the printed circuit board 1 for contact with the terminals 4 on the board. The elastic connector 13 may be adhered to the board at its bottom middle portion where there are no terminals 4.

In the embodiments of FIGS. 13 to 17, a heat-resistant elastic body 24 made of rubber, plastics or a spring is arranged in or under the printed circuit board under its terminal area to ensure contact between the lead pins of the flat type package (or the lead portion of the ceramic tip carrier type package) and the terminals on the printed circuit board when the package is pressed downwardly against the terminals.

Figure 13:
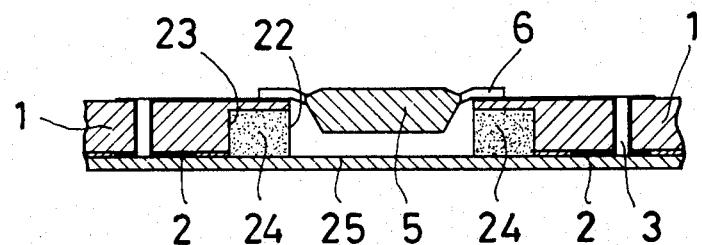
FIG. 13 is a sectional view of the sixth embodiment.

The embodiment of FIG. 13, the printed circuit board 1 is formed with holes 22 to receive the packages 5 to be tested and formed with recesses 23 near the holes 22 to set an elastic body 24 therein. A backing plate 25 is adhered to the back of the printed circuit board 1 to hold the elastic bodies 24 in the recesses 23. Instead of providing the backing plate 25, the elastic bodies may be attached by an adhesive to the printed circuit board 1.

Figure 14:
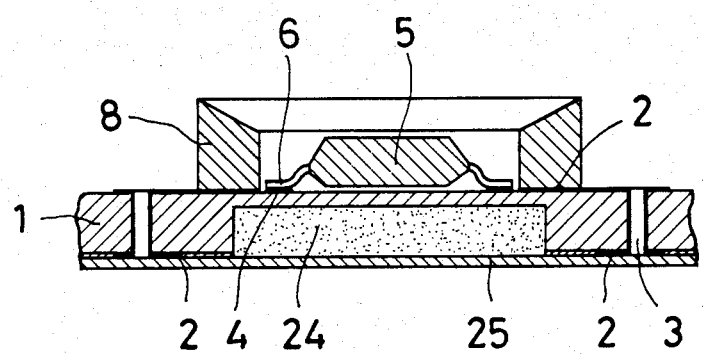
FIG. 14 is a sectional view of the seventh embodiment.

The embodiment of FIG. 14 is similar to that of FIG. 2, but the elastic bodies 24 are embedded in the printed circuit board 1 under the fixing frames 8 and held in position by the backing plate 25.

Figure 15:
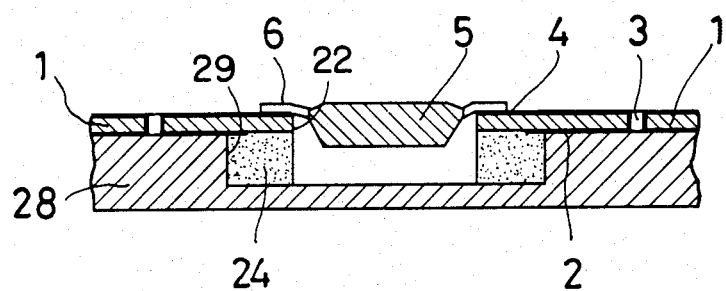
FIG. 15 is a sectional view of the eighth embodiment.

The embodiment of FIG. 15 comprises a printed circuit board 1 formed with the holes 22 to receive the packages 5 to be tested and a base plate 28 formed with recesses 29 in its upper surface to receive the elastic bodies 24 therein and adhered to the bottom surface of the printed circuit board 1.

Figure 16:
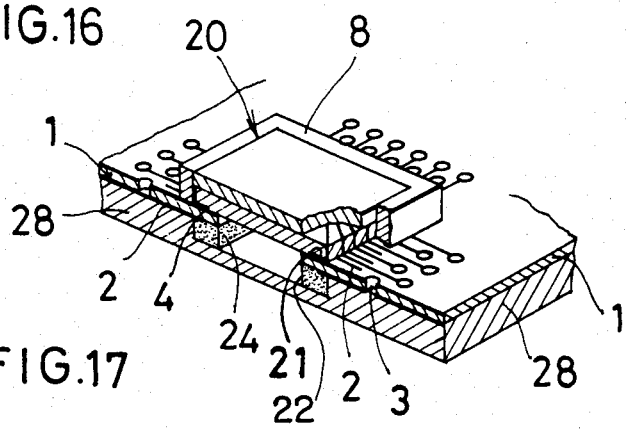
FIG. 16 is a partially cutaway perspective view of the ninth embodiment.

The embodiment of FIG. 16 is similar to that of FIG. 15 except that ceramic tip carrier type packages 20 are mounted in the positioning frames 8 provided on the printed circuit board 1 over the holes 22 thereof with the elastic bodies 24 put therebetween.

Figure 17:
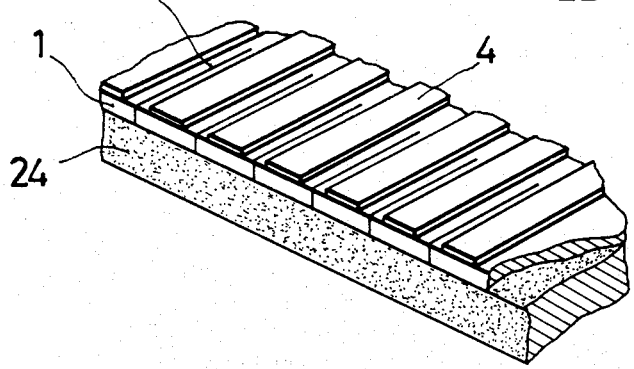
FIG. 17 is a perspective view showing where the printed circuit board is provided with cuts.

In any of the embodiments of FIGS. 13 to 17, the printed circuit board 1 should preferably be provided with cuts 30 between the terminals 4 as shown in FIG. 17 to allow the terminals a slight movement in a vertical direction, thereby insuring contact between the lead pins of the packages 5 and the terminals 4 on the printed circuit board.

Figure 18:
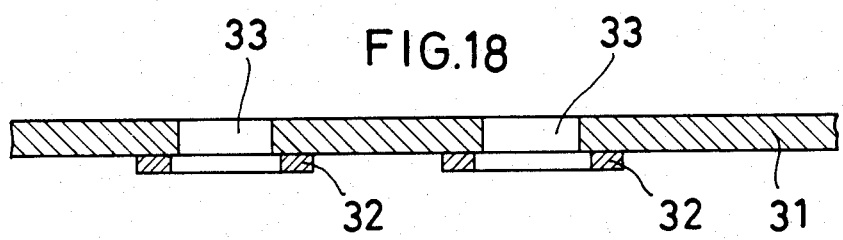
FIG. 18 is a sectional view of the cover plate.

In any of the embodiments in the present invention, a cover plate 31 as is shown in FIG. 18 may be used to press the lead pins 6 of the packages 5 against the terminals 4 on the printed circuit board 1 to insure contact between them. To the back side of the cover plate, elastic bodies 32 such as can be formed of silicone rubber are adhered to press the lead pins of the packages downwardly. The cover plate should preferably be formed with holes 33 for heat radiation. The cover plate may be made of a heat-resistant plastic or a metallic material.

Figure 19:
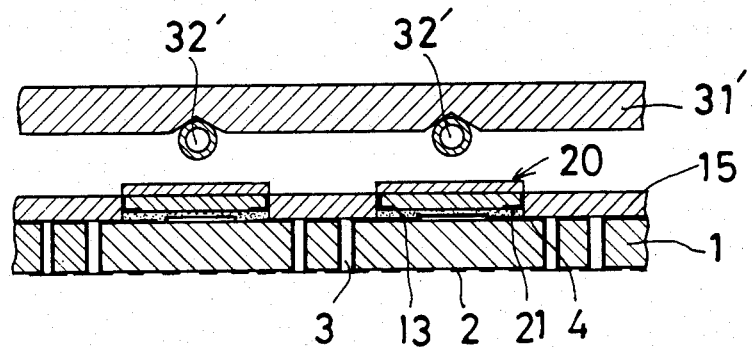
FIG. 19 is a sectional view of another example of the cover plate used with the embodiment of FIG. 12.

FIG. 19 shows another cover plate 31' in use with the embodiment of FIG. 12. It has elastic bodies 32' in the form of a tube, bar or plate of, for example, silicone rubber or a spring, attached to the bottom side thereof. The cover plate serves to prevent trouble due to poor contact.

The material of the printed circuit board used in the present invention is not particularly limited.

In testing semiconductor packages by use of the test boards according to the present invention, the packages may be mounted in position for testing on the test board by means of a handler or a robot.

What are claimed are:

1. A burn-in device for resting leadless semiconductor packages, comprising:
   a printed circuit board having a planar outer board surface and having terminal and electrical circuits thereon and through holes therein, said terminals having outer terminal surfaces formed in planes parallel to said board surface;
   a frame plate on said board having a plurality of through openings over said terminals and of a size for receiving and for positioning respective semiconductor packages therein;
   a plurality of elastic connectors mounted in said openings, said connectors having lower surfaces opposing and contacting said terminal surfaces and upper surfaces opposite said lower surfaces, said upper surfaces being disposed so as to receive the semiconductor packages thereon when the packages are positioned in said openings, said connectors being formed of an elastic material and each having embedded therein a plurality of thin metal wires electrically insulated from each other extending from said lower surfaces to said upper surfaces for providing electrical connection between semiconductor packages on said upper surfaces and said terminal surfaces opposing said lower surfaces; and a cover plate over said board, having a back side opposing said openings and a plurality of elastic bodies attached to said back side and aligned with said openings, said cover plate being movable toward said board such that said elastic bodies press downwardly on the semiconductor packages positioned in said openings so as to elastically press the semiconductor packages against said elastic connectors so as to insure electrical connection of the semiconductor packages with said terminals through said metal wires.

2. a burn-in device as in claim 1, wherein said elastic material is silicone rubber.

* * * * *